US009969274B2

United States Patent
Yoon et al.

(10) Patent No.: US 9,969,274 B2
(45) Date of Patent: May 15, 2018

(54) POWER CONVERSION MODULE FOR VEHICLE

(71) Applicants: Hyundai Motor Company, Seoul (KR); Kia Motors Corporation, Seoul (KR)

(72) Inventors: Jae Hoon Yoon, Seoul (KR); Jung Hong Joo, Gyeonggi-do (KR); Dong Min Shin, Gyeonggi-do (KR); Kang Hoon Ko, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 357 days.

(21) Appl. No.: 14/861,392

(22) Filed: Sep. 22, 2015

(65) Prior Publication Data

US 2016/0332524 A1    Nov. 17, 2016

(30) Foreign Application Priority Data

May 11, 2015    (KR) .................. 10-2015-0065102

(51) Int. Cl.
| | |
|---|---|
| *F01P 1/06* | (2006.01) |
| *F01P 3/12* | (2006.01) |
| *H05K 7/20* | (2006.01) |
| *H02M 7/00* | (2006.01) |
| *B60L 11/18* | (2006.01) |

(Continued)

(52) U.S. Cl.
CPC ............... *B60L 11/18* (2013.01); *B60L 11/00* (2013.01); *F01P 1/06* (2013.01); *F01P 3/12* (2013.01);

(Continued)

(58) Field of Classification Search
CPC .......... H05K 7/20927; H05K 7/20909; H05K 2/70918; H05K 7/1432; F01P 2050/24; F01P 3/12; F01P 1/06; H02M 7/003
See application file for complete search history.

(56) References Cited

U.S. PATENT DOCUMENTS

| 9,402,336 B2 * | 7/2016 | Suzuki | ............... H05K 7/20927 |
| 9,596,782 B2 * | 3/2017 | Nishikimi | ............. H02M 7/003 |

(Continued)

FOREIGN PATENT DOCUMENTS

| JP | 2007-181312 A | 7/2007 |
| JP | 2013-169114 A | 8/2013 |

(Continued)

*Primary Examiner* — Ryan Johnson
(74) *Attorney, Agent, or Firm* — Mintz Levin Cohn Ferris Glovsky and Popeo, P.C.; Peter F. Corless

(57) ABSTRACT

A power conversion module for a vehicle is provided. The module includes a housing and a power conversion unit installed on an inside surface of a bottom panel of the housing. The power conversion unit includes a capacitor module, a power module of an inverter and a LDC. A water-cooling-type cooling unit is installed on an outside surface of the bottom panel of the housing and is in a corresponding position to the power module of the inverter and the LDC, with the bottom panel of the housing interposed therebetween. An air-cooling-type cooling fin is installed on the exterior surface of the bottom panel and is in a corresponding position to a capacitor module, with the bottom panel of the housing interposed therebetween. A radiator blower adjacent to a radiator of a vehicle is configured to generate cooling-air wind to cool the radiator and the air-cooling-type cooling fin.

9 Claims, 4 Drawing Sheets

(51) Int. Cl.
*H02M 7/44* (2006.01)
*H02M 3/04* (2006.01)
*B60L 11/00* (2006.01)
*H02M 3/335* (2006.01)

(52) U.S. Cl.
CPC ......... *H02M 3/04* (2013.01); *H02M 3/33515* (2013.01); *H02M 7/003* (2013.01); *H02M 7/44* (2013.01); *H05K 7/20918* (2013.01); *H05K 7/20927* (2013.01); *F01P 2050/24* (2013.01)

(56) References Cited

U.S. PATENT DOCUMENTS

| | | | | |
|---|---|---|---|---|
| 2009/0243443 | A1* | 10/2009 | Aoki | H02K 11/048 310/68 D |
| 2013/0146254 | A1* | 6/2013 | Jeon | H05K 7/20927 165/104.11 |
| 2015/0216077 | A1* | 7/2015 | Tanaka | H02M 7/003 361/697 |

FOREIGN PATENT DOCUMENTS

| | | |
|---|---|---|
| JP | 2014-212601 A | 11/2014 |
| KR | 10-1997-0065107 B1 | 3/1997 |
| KR | 10-2013-0065390 A | 6/2013 |
| KR | 2014-0105675 A | 9/2014 |
| KR | 10-1448776 B1 | 10/2014 |
| KR | 10-1510056 B1 | 4/2015 |

\* cited by examiner

POWER CONVERSION MODULE FOR VEHICLE

CROSS-REFERENCE(S) TO RELATED APPLICATION

The present application claims priority of Korean Patent Application Number 10-2015-0065102 filed on May 11, 2015, the entire contents of which application is incorporated herein for all purposes by this reference.

BACKGROUND

Field of the Invention

The present invention relates to a power conversion module for environment-friendly vehicles in which a power conversion unit is combined with a housing, a cooling fin, a cooling unit, and a radiator blower.

Description of the Related Art

Generally, electric vehicles or hybrid vehicles are equipped with various electronic power control devices that operate the vehicles such as: a battery that stores electricity (e.g., high voltage direct current power) used to drive a motor therein; an inverter that converts high voltage direct current (DC) output from the battery into high voltage alternating current (AC); and a low voltage DC-DC converter (LDC) that converts the high voltage DC current into low voltage DC current and charges a low voltage battery with the low voltage DC current.

In particular, the inverter converts high voltage DC input to a capacitor module of the inverter into high voltage AC using a power module and transmits the high voltage AC to a motor. The LDC converts high voltage DC into low voltage DC to be used to charge a low voltage battery. Therefore, both the inverter and LDC are essential elements for electric vehicles or hybrid vehicles and are usually installed within the engine compartment of a vehicle. However, the installation of these devices decreases space organization efficiency of a vehicle and results in increased manufacturing costs of a vehicle.

In particular, a structure according to the related art teaches a capacitor module that is shared by an inverter and an LDC. In this construction, a power module of the inverter and the LDC are connected in parallel to the capacitor module. Therefore, an excessive load is applied to the capacitor module, causing the capacitor module to generate a substantial amount of heat. This eventually has negative impact on operation or lifetime of a circuit.

The foregoing is intended merely to aid in the understanding of the background of the present invention, and is not intended to mean that the present invention falls within the purview of the related art that is already known to those skilled in the art.

SUMMARY

Accordingly, the present invention provides a power conversion package for a vehicle mounted within a vehicle, converts high voltage DC into high voltage AC or low voltage DC, and reduces heat generated by a device, thereby improving efficiency and durability of the device.

In particular, the present invention provides a power conversion package for a vehicle that may include: a housing; a power conversion unit installed on an inside surface of a bottom panel of the housing, the power conversion unit including a capacitor module, a power module of an inverter and a low voltage DC-DC converter (LDC); a water-cooling-type cooling unit installed on an outside surface of the bottom panel of the housing and arranged in a corresponding position to the power module of the inverter and the LDC, with the bottom panel of the housing interposed therebetween; an air-cooling-type cooling fin installed on the outside surface of the bottom panel of the housing and arranged in a corresponding position to a capacitor module, with the bottom panel of the housing interposed therebetween; and a radiator blower disposed to be adjacent to a radiator of a vehicle and configured to generate cooling-air wind that simultaneously cools the radiator and the air-cooling-type cooling fin.

The power conversion module may further include a high voltage input connector disposed adjacent to an inside wall surface of the housing and connected to the capacitor module of the power conversion unit to apply a high voltage. The power module of the inverter, the LDC, and the capacitor module may be arranged on the same plane to constitute the power conversion unit. Additionally, the power module of the inverter and the LDC may be adjacent to each other in a backward-forward direction of a vehicle. The capacitor module may be adjacent to respective sides of the power module of the inverter and the LDC. The capacitor module may also be electrically connected to the power module of the inverter via a first line in a position when the capacitor module faces the power module of the inverter, and the capacitor module may be electrically connected to the LDC via a second line in a position when the capacitor module faces the LDC.

The power module of the inverter may have a narrower width than the LDC in a widthwise direction of a vehicle and the power module of the inverter and the LDC may be adjacent to the capacitor module. The housing may contain (e.g., enclose) the power module of the inverter, the LDC, and the capacitor module to be in tight contact with (e.g., to abut) edges of the power module of the inverter, the LDC, and the capacitor module. Additionally, a depressed portion of the housing may be formed in a position when the power module of the inverter connects with the LDC. The power conversion module may include a high voltage output connector disposed in the depressed portion of the housing and connected to the power module of the inverter, with the housing therebetween and may be configured to output an alternating current voltage.

The air-cooling-type cooling fin may have an air channel which is in parallel with a direction of a cooling-air wind generated by the radiator blower. Further, the air-cooling-type cooling fin and the capacitor module may be arranged to face the radiator blower in a backward-forward direction of a vehicle. In the power conversion module, a cooling water channel of the water-cooling-type cooling unit may be connected to a radiator to dissipate heat of the power module of the inverter and the LDC using the radiator and to dissipate heat of the capacitor module using the air-cooling-type cooling fin.

The power conversion module for a vehicle structured as described above has the following advantages:

First, since a capacitor module uses an air cooling technology to enhance heat dissipation efficiency, efficiency and durability of devices for a vehicle may be improved.

Second, since a high voltage DC input terminal may be positioned within a housing and an AC output terminal for driving a motor may be positioned within a depressed portion of the housing, it may be possible to prevent dielectric breakdown that may occur when a high voltage connector collides with parts installed within an engine compartment.

Third, since a distance between a capacitor module and an LDC may be reduced, electromagnetic compatibility may be improved and production cost may be reduced.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Hereinafter, exemplary embodiments of the present invention will be described in detail with reference to the accompanying drawings.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the tem) controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "an", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Figure 1:
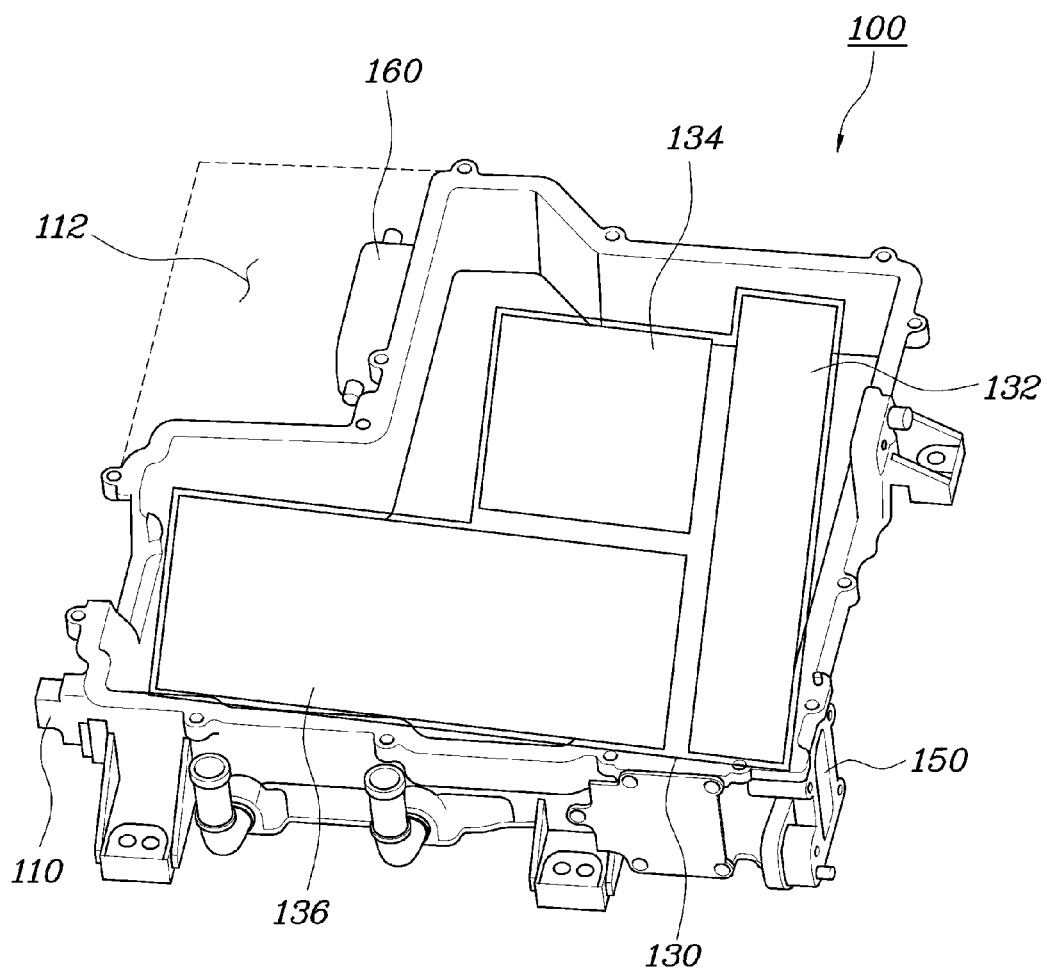
FIG. 1 is a diagram illustrating arrangement of a power conversion unit and a housing according to one exemplary embodiment of the present invention.
Figure 2:
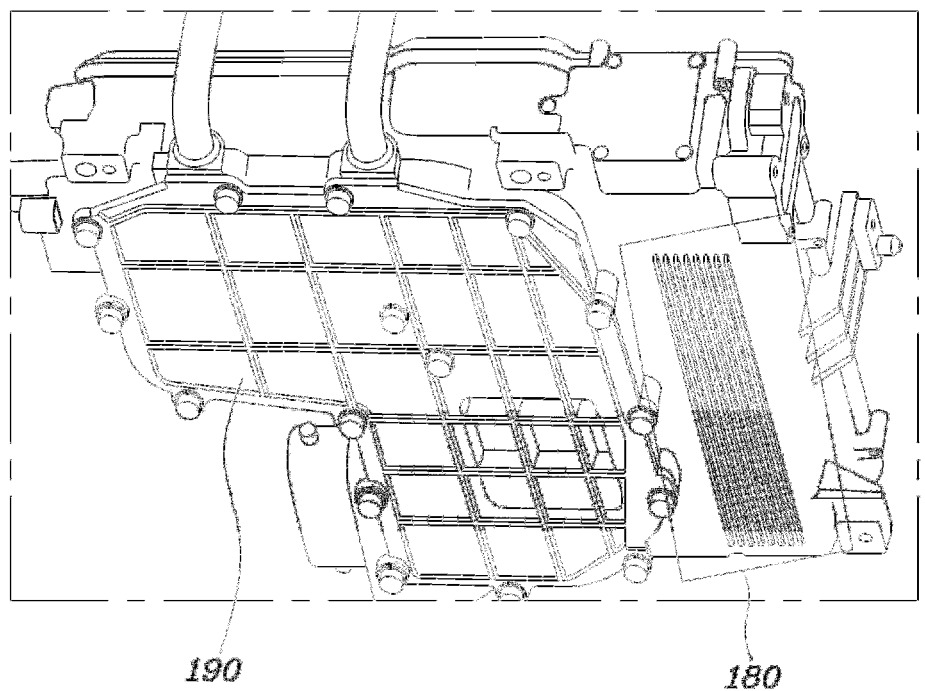
FIG. 2 is a diagram illustrating arrangement of a power conversion unit and a cooling unit according to the exemplary embodiment of the present invention.
Figure 3:
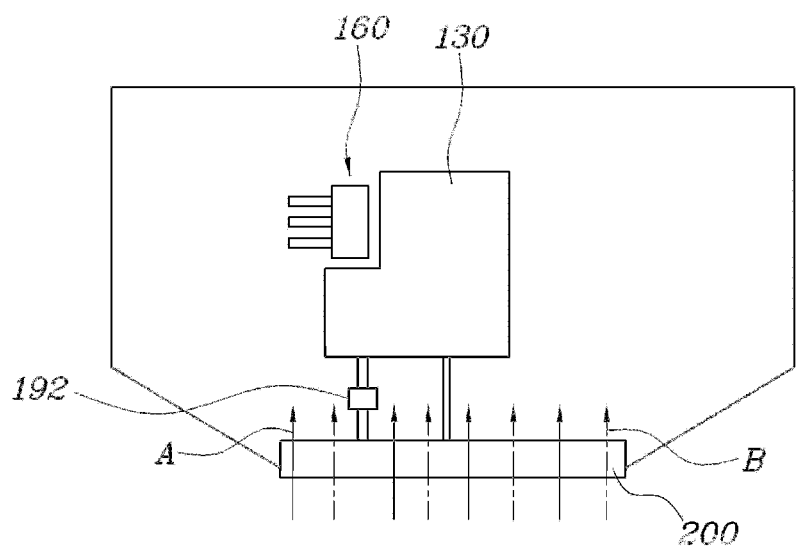
FIG. 3 is a diagram illustrating arrangement of the power conversion unit viewed from the front side of a vehicle according to the exemplary embodiment of the present invention.

FIGS. 1 through 3 are diagrams illustrating a power conversion module 100 for a vehicle according to an exemplary embodiment of the present invention. As illustrated in FIGS. 1 through 3, the power conversion module 100 may include a housing 110, a capacitor module 132, a power conversion unit 130 including a power module 134 of an inverter and a low voltage DC-DC converter (LDC) 136, a water-cooling-type cooling unit 190, an air-cooling-type cooling fin 180, and a radiator blower 200.

The capacitor module 132 may be installed within the housing and may be attached to a bottom surface of the housing 110. The water-cooling-type cooling unit 190 may be installed on an exterior bottom surface of the housing 110 and may be arranged in a corresponding position to the power module 134 of the inverter and the LDC 136 with the bottom plate of the housing 110 interposed therebetween. The air-cooling-type cooling fin 180 may be installed on the exterior bottom surface of the housing 110 and may be arranged in a corresponding position to the capacitor module 132 with the bottom plate of the housing 110 interposed therebetween. The radiator blower 200 may be adjacent to a radiator of a vehicle and may be configured to generate a stream of cooling air (hereinafter, referred to as cooling-air wind) A that simultaneously cools the radiator and the air-cooling-type cooling fin 180.

Specifically, the air-cooling-type cooling fin 180 may be arranged such that an air channel 182 through which air flows is disposed in parallel with the cooling-air wind A generated by the radiator blower 200. Both of the air-cooling-type cooling fin 180 and the capacitor module 132 may be disposed to extend in a lengthwise direction (e.g., backward-forward direction) of a vehicle and to face the radiator blower 200. The air channel 182 may be generated by the cooling-air wind A generated by the radiator blower 200 disposed in the front of a vehicle. In other words, the air channel 182 may be formed to extend in an A direction in FIG. 3.

In addition, as illustrated in FIG. 3, the direction of vehicle wind B generated when a vehicle travels and the direction of the cooling air wind A generated by the radiator blower 200 may be the same. Therefore, the vehicle wind B may also flow in a B direction in FIG. 3. Further, the air-cooling-type cooling fin 180 disposed on the bottom panel of the housing may take various forms. When the cooling-air wind A generated by the radiator blower 200 and the air channel 182 attributable to the vehicle wind B are in the same direction, the amount of heat generated by the capacitor module 132 that faces the air-cooling-type cooling fin 180 may be substantially reduced for the reasons discussed below.

The cooling-air wind A generated by the radiator blower 200 and that flows through the air channel 182, and the vehicle wind B have the property of flowing substantially straight (e.g. linearly). Therefore, the intensity of the winds may diminish when the winds meet (e.g., collide with or come into contact with) an obstacle that extends in a direction different from the direction of the winds. In other words, when the cooling-air wind A generated by the radiator blower 200 and the vehicle 200 flow through the air-cooling-type cooling fin 180 without resistance, the heat generated by the capacitor module 132 may be reduced significantly.

Figure 4:
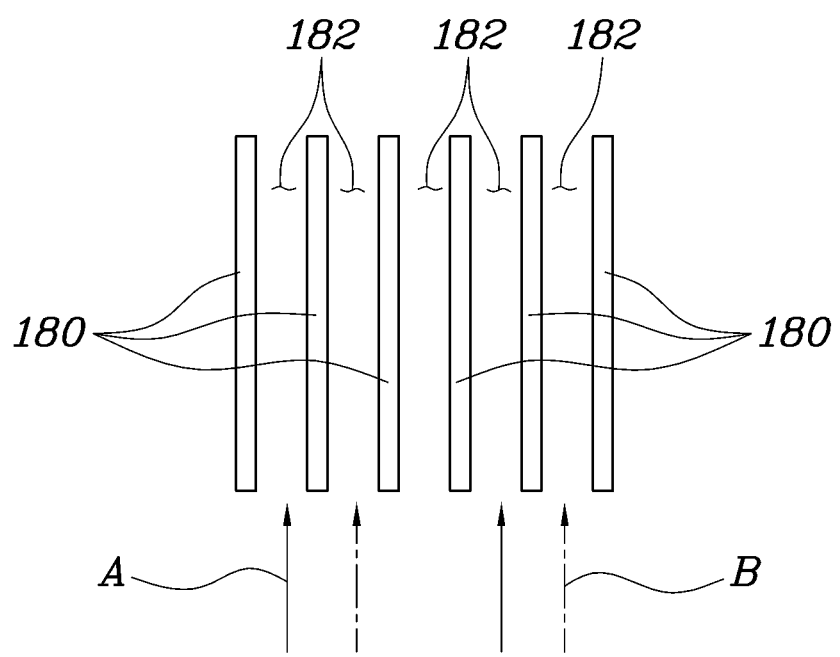
FIG. 4 is a diagram illustrating the direction of an air channel and the construction of a cooling fin according to the exemplary embodiment of the present invention.

Therefore, when the air-cooling-type cooling fin 180 is disposed in the same direction as the cooling-air wind A and the vehicle wind B, the heat generated by the capacitor module 132 may be effectively reduced. The detailed arrangement of the air-cooling-type cooling fin 180 is shown in FIG. 4. In addition, the cooling channel of the water-cooling-type cooling unit 190 may be connected to the existing radiator installed within a vehicle, thereby reducing the heat generated by the power module 134 of the inverter and the LDC 136.

Particularly, as illustrated in FIG. 3, the water-cooling-type cooling unit 190 operated to heat water in the water-cooling-type cooling unit 190 due to operation of the power module 134 of the inverter and the LDC 136 may be circulated by a water pump 192, and the heated water may be cooled by the cooling-air wind A generated by the radiator blower 200 or the vehicle wind B while the heated water is circulating. In other words, while the water is circulating, the heat generated by the power module 134 of the inverter and the LDC 136 may be reduced. Therefore, according to the power conversion module 100 of the present invention, the heat generated by the capacitor module 132, the power module 134 of the inverter, and the LDC 136 that constitute the power conversion unit 130 may be reduced using the radiator, the radiator blower 200, and the water pump 192 with which existing vehicles are equipped.

In addition, reduction of the heat generated by the capacitor module 132, the power module 134 of the inverter, and the LDC 136 may lead to a decrease in the heat generated by capacitors, inductors, diodes, etc. that constitute circuits of various devices. When the heat generated by the circuits is reduced, the circuits may operate more stably. Electronic elements electrically connected are prone to heat damage. Thus, when the amount of heat is increased, durability and performance of the electrical elements may deteriorate. According to the exemplary embodiment of the present invention, it may be possible to reduce the heat generated by the capacitor module 132, the power module 134 of the inverter, and the LDC 136 that constitute the power conversion unit 130 using the air-cooling-type cooling fin 180 and the water-cooling-type cooling unit 190, and thus durability of performance efficiency of the capacitor module 132, the power module 134 of the inverter, and the LDC 136 may be improved.

In the exemplary embodiment of the present invention, heat reduction for the capacitor module 132 may be maximized by arranging the air-cooling-type cooling fin 180 on the bottom panel of the housing 11, particularly in a corresponding position to the capacitor module 132. This arrangement may be designed due to the circuit connection in which the capacitor module 132 may be connected in parallel with both the power module 134 of the inverter and the LDC 136. Due to the parallel connection, the capacitor module 132 may be configured to receive a greater amount of load compared to the power module 134 or the LDC 136. Therefore, the capacitor module 132 may be configured to generate a substantial amount of heat compared to the power module 134 of the inverter or the LDC 136.

Furthermore, the cooling method using the air-cooling-type cooling fin 180 does not require operation of the water pump 192 unlike the water-cooling-type cooling unit 190, which may be arranged in a corresponding position to the power module 134 and the LDC 136. In other words, it may be possible to reduce the heat generated by the capacitor module 132 with the mere use of the cooling-air wind A generated by the radiator blower 200. In addition, while a vehicle is traveling (e.g., while a vehicle is being driven), as described above, the vehicle wind B attributable to the movement of a vehicle forms the air channel in the B direction of FIG. 3. Therefore, it may be possible to reduce the heat generated by the capacitor module 132 without operating the water pump 192 or the radiator blower 200 and with use of only the air-cooling-type cooling fin 180.

In other words, when reducing the heat generated due to operation of a circuit of the capacitor module 132 with the mere use of the vehicle wind B, the heat generated by the capacitor module 132 may be reduced without operation of additional cooling devices such as the water pump 192 and the radiator blower 200. Therefore, total power efficiency of a vehicle may be improved, thus increasing the fuel efficiency.

Moreover, the power conversion module may further include a high voltage input connector 150 and a high voltage output connector 160 combined with the power conversion unit 130 as illustrated in FIG. 1. The high voltage input connector 150 may be disposed adjacent to an inside wall surface of the housing 110. The high voltage input connector 150 may be connected to the capacitor module 132 of the power conversion unit 130, and thus may be configured to apply a high voltage to the capacitor module 132. The high voltage output connector 160 may be disposed in a depressed portion 112 of the housing and may be connected to the power module 134 of the inverter with the housing therebetween, thereby outputting an alternating current voltage to the power module 134. The depressed portion 112 may be formed in a position when the power module 134 of the inverter and the LDC 136 meet each other (e.g., connect).

In other words, as illustrated in FIG. 1, the high voltage input connector 150 may be disposed within the housing 110 and the high voltage output connector 160 may be disposed in the depressed portion (e.g., a depression) of the housing. Therefore, the connectors may not be exposed and may be protected by the housing 110. Accordingly, during a vehicle collision at the front or rear part of a vehicle, high voltage dielectric breakdown, which may occur when the high voltage connectors collide with internal parts installed within an engine compartment, may be prevented and high voltage safety regulations may be satisfied.

In addition, according to the exemplary embodiment of the present invention, as illustrated in FIG. 1, the power module 134 of the inverter, the LDC 136, and the capacitor module 132 may be disposed on the same plane to constitute the power conversion unit 130. The power module 134 of the inverter and the LDC 136 may be disposed adjacent to each other in a backward-forward direction of a vehicle (e.g., along a longitudinal direction of the vehicle, that is, along the lengthwise direction of the vehicle), and the capacitor module 132 may be disposed adjacent to sides of the power module 134 of the inverter and the LDC 136. The capacitor module 132 may be electrically connected to the power module 134 via a first line in a position when the capacitor module 132 faces the power module 134 of the inverter and connected to the LDC 136 via a second line in a position where the capacitor module 132 faces the LDC 136.

The power module 134 of the inverter may be narrower than the LDC 136 in a widthwise direction of a vehicle. The power module 134 of the inverter and the LDC 136 may be disposed to be adjacent to (e.g., may abut or be proximate to)

the capacitor module 132. The housing 110 may enclose (e.g., house or contain) the power module 134 of the inverter, the LDC 136, and the capacitor module 132 while adjacent to the edges of (e.g., while abutting) the power module 134 of the inverter, the LDC 136, and the capacitor module 132.

According to a conventional art, a capacitor module, a power module of an inverter, and an LDC are disposed within a housing and are disposed in parallel in a widthwise direction of an existing vehicle. However, according to the exemplary embodiment of the present invention, the capacitor module 132 may be disposed in contact with the LDC 136 as well as with the power module 134 of the inverter. Therefore, the distance between the capacitor module 132 and the LDC 136 may be reduced to thus stabilize a power circuitry. Accordingly, electromagnetic compatibility of the LDC 136 may be improved. Since a wire or a bus bar that has been used in existing power conversion modules may be eliminated, production cost may be reduced. In addition, since the size of the housing may be reduced due to space-organization effective arrangement of the capacitor module 132, the power module 134 of the inverter, and the LDC 136, the space of an engine compartment of a vehicle may be more effectively organized.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A power conversion module for a vehicle, comprising:
   a housing;
   a power conversion unit installed on an inside surface of a bottom panel of the housing and including a capacitor module, a power module of an inverter and a low voltage DC-DC converter (LDC);
   a water-cooling-type cooling unit installed on an exterior surface of the bottom panel of the housing and disposed in a corresponding position to the power module of the inverter and the LDC, with the bottom panel of the housing interposed therebetween;
   an air-cooling-type cooling fin installed on the exterior surface of the bottom panel of the housing and disposed in a corresponding position to the capacitor module, with the bottom panel of the housing interposed therebetween; and
   a radiator blower adjacent to a radiator of a vehicle and configured to generate cooling-air wind that simultaneously cools the radiator and the air-cooling-type cooling fin.

2. The power conversion module according to claim 1, further comprising:
   a high voltage input connector disposed adjacent to an inside wall surface of the housing and connected to the capacitor module of the power conversion unit to apply a high voltage.

3. The power conversion module according to claim 1, wherein the power module of the inverter, the LDC, and the capacitor module are disposed on the same plane to constitute the power conversion unit, wherein the power module of the inverter and the LDC are disposed adjacent to each other in a lengthwise direction of a vehicle, and wherein the capacitor module is adjacent to respective sides of the power module of the inverter and the LDC.

4. The power conversion module according to claim 3, wherein the capacitor module is electrically connected to the power module of the inverter via a first line in a position where the capacitor module faces the power module of the inverter, and wherein the capacitor module is electrically connected to the LDC via a second line in a position where the capacitor module faces the LDC.

5. The power conversion module according to claim 3, wherein the power module of the inverter is narrower than the LDC in a widthwise direction of a vehicle, the power module of the inverter and the LDC abut the capacitor module, the housing encloses the power module of the inverter, the LDC, and the capacitor module to abut edges of the power module of the inverter, the LDC, and the capacitor module, and a depressed portion of the housing is formed in a position where the power module of the inverter meets the LDC.

6. The power conversion module according to claim 5, further comprising:
   a high voltage output connector disposed in the depressed portion of the housing and connected to the power module of the inverter, with the housing therebetween, and configured to output an alternating current voltage.

7. The power conversion module according to claim 1, wherein the air-cooling-type cooling fin includes an air channel disposed in parallel with a direction of a cooling-air wind generated by the radiator blower.

8. The power conversion module according to claim 1, wherein the air-cooling-type cooling fin and the capacitor module are disposed to face the radiator blower in a lengthwise direction of a vehicle.

9. The power conversion module according to claim 1, wherein a cooling water channel of the water-cooling-type cooling unit is connected to a radiator to dissipate heat of the power module of the inverter and the LDC using the radiator and wherein heat of the capacitor module is dissipated using the air-cooling-type cooling fin.

* * * * *